United States Patent [19]

Lloyd et al.

[11] Patent Number: 5,295,488

[45] Date of Patent: Mar. 22, 1994

[54] METHOD AND APPARATUS FOR PROJECTING DIAGNOSTIC IMAGES FROM VOLUMED DIAGNOSTIC DATA

[75] Inventors: Robert F. Lloyd, Muskego; Christopher J. Wilbricht, Madison, both of Wis.

[73] Assignee: General Electric Company, Milwaukee, Wis.

[21] Appl. No.: 925,544

[22] Filed: Aug. 5, 1992

[51] Int. Cl.⁵ ............................................. A61B 6/00
[52] U.S. Cl. ............................... 128/653.1; 128/653.2;
128/660.07; 324/309; 364/413.19; 364/413.22;
378/4; 378/901; 382/46; 382/56
[58] Field of Search ............ 128/653.1, 660.07, 653.2,
128/661.02, 916; 324/309, 312; 364/413.13,
413.14, 413.19, 413.22, 413.24, 413.25; 378/4,
901; 73/602; 382/46, 56

[56] References Cited

U.S. PATENT DOCUMENTS

4,985,834 1/1991 Cline et al. .................... 364/413.22
4,991,579 2/1991 Allen ............................. 128/653.1
5,068,808 11/1991 Wake ........................ 364/413.19 X Primary Examiner—Ruth S. Smith
Attorney, Agent, or Firm—Quarles & Brady

[57] ABSTRACT

A method and apparatus for manipulating diagnostic images obtained with computed tomography or magnetic resonance systems calculates the rotation of the data around two orthogonal axes and then compresses the data to a plane before rotating it about a third axis normal to the plane. Although apparently less efficient that the rotation about all three axes at once, this procedure is uniquely adapted to the limitations of computer memory access and the calculation speed limits of current computer hardware. Bifurcation of the rotation allows data to be accessed at consecutive addresses speeding memory operations. The bifurcation also permits some calculations to be preperformed and recalled for subsequent voxels. The compressed data is displayed as an image having a particular viewing angle determined by the rotations of the data.

12 Claims, 5 Drawing Sheets

METHOD AND APPARATUS FOR PROJECTING DIAGNOSTIC IMAGES FROM VOLUMED DIAGNOSTIC DATA

BACKGROUND OF THE INVENTION

1. Field of the Invention

This invention relates to a method and apparatus for generating images from physiological data acquired at multiple points in a volume. In particular, the invention relates to a method of generating images, the method accommodating the physical constraints of conventional computer hardware so as to increase the speed with which diagnostic images may be transformed and displayed.

2. Background Art

Advances in technology have provided the medical practitioner with a variety of medical imaging systems. One important class of medical imaging systems works by radiating energy through a region of interest in the body, either from an external source, such as x-rays or an RF field, or from an internal source such as an injected radioisotope. The interaction of the radiated energy with the body is measured at a variety of small volume elements ("voxels") within the body. The spatial coordinates of each of these voxels are identified and a map of the body within that region of interest is developed.

Two important types of medical imaging systems which provide such voxel data are Magnetic Resonance Imaging ("MRI") and X-ray Computed Tomography ("CT").

a. Magnetic Resonance Imaging

Any nucleus which possesses a magnetic moment attempts to align itself with the direction of the magnetic field in which it is located. In doing so, the nucleus precesses around this direction at a characteristic angular frequency (Larmor frequency) which is dependent on the strength of the magnetic field and on the properties of the specific nuclear species, i.e. the gyromagnetic constant $\gamma$ of the nucleus. This property of the nuclei causing the precession is termed spins—in an analogy to gyroscopic precession.

When a substance such as human tissue is subjected to a uniform magnetic field, the individual magnetic moments of the spins in the tissue precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another.

If the tissue is subjected to an oscillating radio frequency magnetic field which is in the x-y plane and which is near the Larmor frequency, the net aligned moment, $M_z$, may be rotated, or "tipped", into the x-y plane to produce a net transverse magnetic moment $M_t$, rotating in the x-y plane at the Larmor frequency. The degree to which the net magnetic moment $M_z$ is tipped, and hence the magnitude of the net transverse magnetic moment $M_t$ depends primarily on the length of time and the magnitude of the applied excitation field.

The practical value of this phenomenon resides in the signal which is emitted by the excited spins after the excitation signal is terminated. In simple systems, the excited spins induce an oscillating sine wave signal in a receiving coil. The frequency of this signal is the Larmor frequency, and its initial amplitude is determined by the magnitude of the transverse magnetic moment.

The amplitude of the emission signal decays in an exponential fashion with time, t:

$$A = A_0 e^{t/T^*_2} \tag{1}$$

The decay constant $1/T^*_2$ depends on the homogeneity of the magnetic field and on $T_2$, which is referred to as the "spin-spin relaxation" constant, or the "transverse relaxation" constant. The $T_2$ constant is inversely proportional to the exponential rate at which the aligned precession of the spins would dephase after removal of the excitation signal in a perfectly homogeneous field.

Another important factor which contributes to the amplitude of the NMR signal is referred to as the spin-lattice relaxation process which is characterized by the time constant $T_1$. It describes the recovery of the net magnetic moment M to its equilibrium value along the axis of magnetic polarization (z). The $T_1$ time constant is longer than $T_2$, much longer in most substances of medical interest.

The NMR measurements of particular relevance to the present invention are called "pulsed NMR measurements". Such NMR measurements are divided into a period of RF excitation and a period of signal emission. Such measurements are performed in a cyclic manner in which the NMR measurement is repeated many times to accumulate different data during each cycle or to make the same measurement at different locations in the subject. A wide variety of preparative excitation techniques are known which involve the application of one or more RF excitation pulses of varying magnitude, duration, and direction. The prior art is replete with excitation techniques that are designed to take advantage of particular NMR phenomena and which overcome particular problems in the NMR measurement process.

When utilizing NMR to produce images it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

Typically, the volume which is to be imaged (region of interest) is scanned by a sequence of NMR measurement cycles. The resulting set of received NMR signals are digitized and processed to reconstruct data indicating the physical properties of specific voxels within the imaged volume. The voxel data is stored in an array in memory so that the spatial coordinates of each voxel may be identified.

b. Computed X-Ray Tomography

In a computed tomography system, an x-ray source is collimated to form a fan beam with a defined fan beam angle. The fan beam is oriented to lie within the x-y plane of a Cartesian coordinate system, termed the "gantry plane", and is transmitted through an imaged object, such as human tissue, to an x-ray detector array oriented within the gantry plane.

The detector array is comprised of a set of detector elements each of which measures the intensity of transmitted radiation along a different ray projected from the x-ray source to the particular detector element. The intensity of the transmitted radiation is dependent on the attenuation of the x-ray beam along that ray by the tissue.

The x-ray source and detector array are rotated on a gantry within the gantry plane and around a center of rotation within the tissue so that the angle at which the fan beam axis intersects the tissue may be changed. At each gantry angle, a projection is acquired comprised of the intensity signals from each detector element. The gantry is then rotated to a new angle and the process is repeated to collect a number of projections along a number of gantry angles to form a tomographic projection set.

The acquired tomographic projection sets are typically stored in numerical form for later computer processing to "reconstruct" a slice image according to reconstruction algorithms known in the art. The reconstruction process converts the data of the rays, which represents total attenuation along the lines of the rays, to voxel data which represents the incremental x-ray attenuation provided by a voxel within the scanned area.

A typical computed tomographic study involves the acquisition of a series of "slices" of the imaged tissue, each slice parallel to the gantry plane and having a slice thickness dictated by the width of the detector array, the size of the focal spot, the collimation and the geometry of the system. Each successive slice is displaced incrementally along a z-axis, perpendicular to the x and y axes, so as to provide a third spatial dimension of information. After reconstruction, voxel data over a volume of the patient is obtained.

c. The Display of Voxel Data

As noted above, each of these imaging systems employs energy radiated through a region of interest of the body and detects the interaction of the energy with the body to acquire data at a plurality of voxels. The type of radiated energy is different for different imaging systems. The radiated energy is x-rays in the case of computed tomography (CT) and a radio frequency magnetic field in the case of nuclear magnetic resonance imaging (MRI). The energy is sound waves in the case of ultrasound and high energy particles from an injected radioisotope in the case of nuclear medicine or PET scanning. In each case voxel data is obtained over a volume.

The processing and display of the voxel data produced by the above systems presents two problems. The first problem is simply the large amount of data that is acquired: a typical study may generate data for over 4,000,000 voxels. Efficient processing of this data is essential if the technology is to be practically useable.

The second problem is the need to present the voxel data in a meaningful way. The data is unintelligible when represented as numerals alone, so typically, each voxel value is projected to a brightness value of a picture element ("pixel") on an image plane. The pixels of the image plane together produce a picture-like image. The image may be more easily understood to a human operator.

Projecting the voxels of the three dimensional volume to the pixels of a two dimensional picture requires discarding some voxel information. Ideally, however, an appropriately selected image plane will capture most of the diagnostically significant information. Alternatively, several image planes may be generated, and viewed sequentially. In this latter case, just as one may comprehend the three dimensions of a statue by viewing it from various angles, the multiple projections allow one to gain a more complete understanding of the voxel data.

In both cases, it is critical that the orientation of the image plane be freely selected, easily adjusted and that new images be rapidly generated. This allows the ideal image plane to be determined on an interactive basis, or permits the quick shifting between different image planes necessary to visualize the three dimensions of the data.

The present methods of rotating and projecting three dimensional arrays of data onto an image plane become unacceptably slow when used to process the large amounts of voxel data associated with typical medical imaging systems. Ideally, the data should be capable of rotation and projection on a near "real-time" basis much as one might rotate a physical object within one's hands.

SUMMARY OF THE INVENTION

The present invention significantly increases the speed with which large arrays of voxel data may be rotated and projected, thereby improving the ability of a human operator to understand and use such data.

Specifically, acquired voxel data is initially rotated about a first and second perpendicular axis. After this rotation, the voxel data is compressed along a third axis orthogonal to the first and second axes to produce a plane of pixels having first and second image coordinates orthogonal to the third axis. The pixel data is then rotated about the third orthogonal axis and the rotated pixels are displayed.

It is one object of the invention to allow rapid rotation of large arrays of voxel data from medical imaging systems. Rotation about three orthogonal axes allows arbitrary rotational positioning of an array. The present invention's compressing of the voxels to pixels after rotation about only two of the axes permits the computer hardware of this imaging system to be utilized more effectively. Specifically, the bifurcation of the rotation process causes rows of input voxels to map rows of pixels, simplifying and speeding the transfer of data to and from computer memory. The sequential calculation of adjacent pixels in a row also permits the sharing of significant parts of the calculation for each adjacent pixel with other calculations for pixels of the row.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DETAILED DESCRIPTION OF THE PREFERRED EMBODIMENT

1. Medical Imaging Equipment
   a. Magnetic Resonance Imaging

Figure 1:
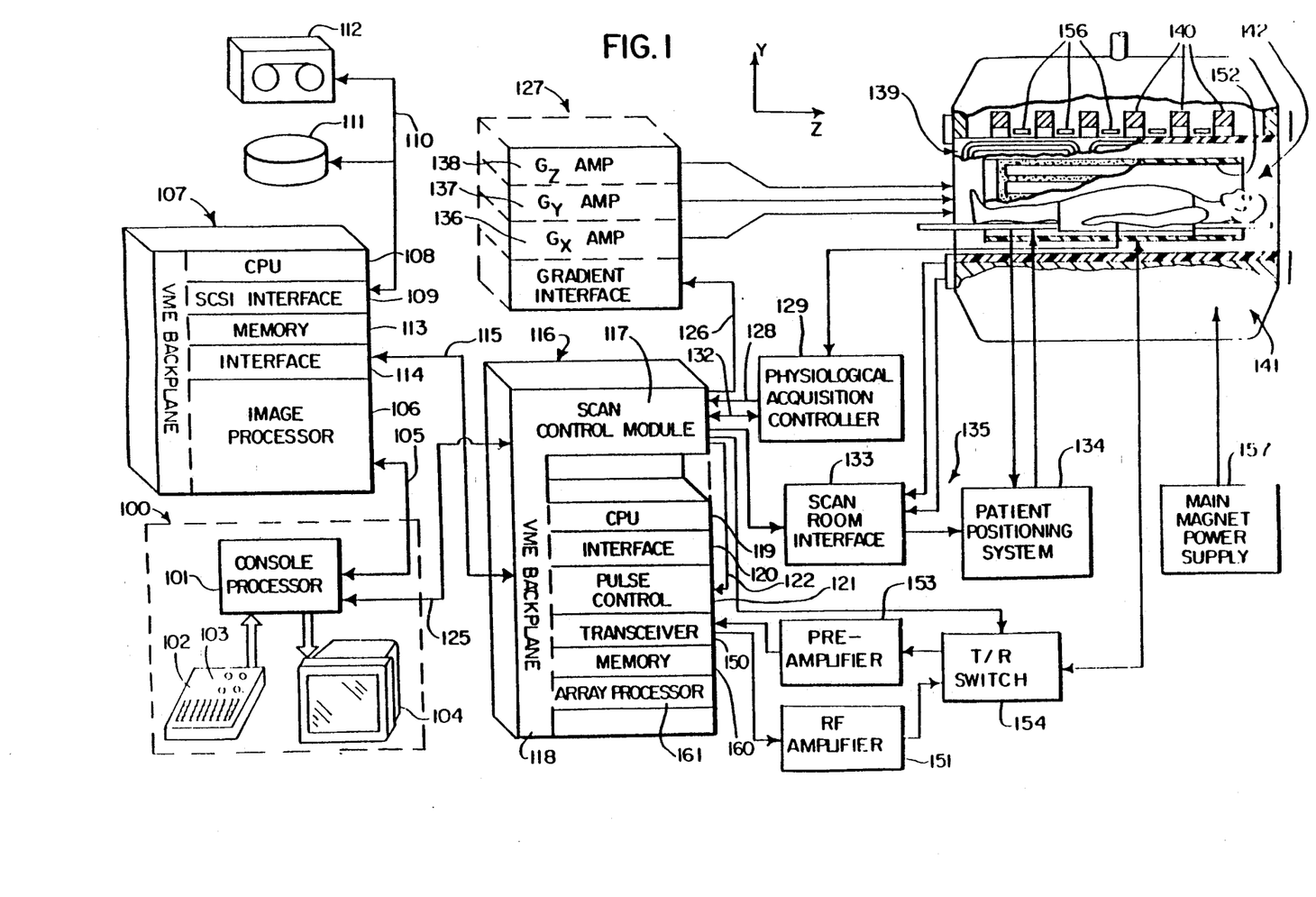
FIG. 1 is a block diagram of an NMR system which employs the present invention.

Referring first to FIG. 1, there is shown the major components of a preferred NMR system which incorporates the present invention and which is sold by the General electric Company under the trademark "SIGNA". The operation of the system is controlled from an operator console 100 which includes a console processor 101 that scans a keyboard 102 and receives inputs from a human operator through a control panel 103. The console processor 101 also drives a video display 104 to produce images. The data for these images is received through a serial link 105 from an image processor 106 that forms part of a separate computer system 107.

The computer system 107 is formed about a backplane bus which conforms with the VME standards, and it includes a number of modules which communicate with each other through this backplane. In addition to the image processor 106, these include a CPU module 108 that controls the VME backplane, and an SCSI interface module 109 that connects the computer system 107 through a bus 110 to a set of peripheral devices, including disk storage 111 and tape drive 112. The computer system 107 also includes a memory module 113 for storing voxel data arrays, and a serial interface module 114 that links the computer system 107 through a high speed serial link 115 to a system control 116.

The system control 116 includes a scan control module 117 which is incorporated as part of a backplane 118, and a series of modules which are connected together by the backplane 118. The backplane 118 conforms to the VME standards and it is controlled by a CPU module 119. A serial interface module 120 connects this backplane 118 to the high speed serial link 115, and a pulse control module 121 connects the backplane 118 to the scan control module 117 through a link 122. The scan control module 117 is also connected to the operator console 100 through a serial link 125, and it is through this link that the system control 116 receives commands from the operator which indicate the scan sequence that is to be performed.

The scan control module 117 operates the system components to carry out the desired scan sequence. It conveys data to the pulse control module 121 which indicates the timing, strength and shape of the RF pulses which are to be produced, and the timing of and length of the data acquisition. The scan control module 117 also connects through serial link 126 to a set of gradient amplifiers 127, and it conveys data thereto which indicates the timing and shape of the gradient pulses that are to be produced during the scan. The scan control module 117 also receives patient data through a serial link 128 from a physiological acquisition controller 129. The physiological acquisition controller 129 can receive a signal from a number of different sensors connected to the patient. For example, it may receive ECG signals from electrodes or respiratory signals from a bellows and produce pulses for the scan control module 117 that synchronizes the scan with the patient's cardiac cycle or respiratory cycle. And finally, the scan control module 117 connects through a serial link 132 to a scan room interface circuit 133 which receives signals at inputs 135 from various sensors associated with the position and condition of the patient and the magnet system. It is through the scan room interface circuit 133 that a patient positioning system 134 receives commands which move the patient cradle and transport the patient to the desired position for the scan.

The gradient waveforms produced by the scan control module 117 are applied to a gradient amplifier system 127 comprised of $G_x$, $G_y$ and $G_z$ amplifiers 136, 137 and 138, respectively. Each amplifier 136, 137 and 138 is utilized to excite a corresponding gradient coil in an assembly generally designated 139. The gradient coil assembly 139 forms part of a magnet assembly 141 which includes a polarizing magnet 140 that produces a 1.5 Tesla polarizing field that extends horizontally through a bore 142. The gradient coils 139 encircle the bore 142, and when energized, they generate magnetic fields in the same direction as the main polarizing magnetic field, but with gradients $G_x$, $G_y$ and $G_z$ directed in the orthogonal x-, y- and z-axis directions of a Cartesian coordinate system. That is, if the magnetic field generated by the main magnet 140 is directed in the z direction and is termed $B_0$, and the total magnetic field in the z direction is referred to as $B_z$, then $G_x = \partial B_z/\partial x$, $G_y = \partial B_z/\partial y$ and $_z = \partial B_z/\partial z$, and the magnetic field at any point (x,y,z) in the bore 142 is given by $B(x,y,z) = B_0 + G_x x + G_y y + G_z z$. The gradient magnetic fields are utilized to encode spatial information into the NMR signals emanating from the patient being studied.

Located within the bore 142 is a circular cylindrical whole-body RF coil 152. This coil 152 produces a transverse RF field in response to RF pulses provided by a transceiver module 150 in the system control cabinet 116. These pulses are amplified by an RF amplifier 151 and coupled to the RF coil 152 by a transmit/receive switch 154. Waveforms and control signals are provided by the pulse control module 121 and utilized by the transceiver module 150 for RF carrier modulation and mode control. The resulting NMR signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the scan control module 117 to electrically connect the RF amplifier 151 to the coil 152 during the transmit mode and to connect the preamplifier 153 during the receive mode. The transmit/receive switch 154 also enables a separate RF coil (not shown) to be used in either the transmit or receive mode.

In addition to supporting the polarizing magnet 140 and the gradient coils 139 and RF coil 152, the main magnet assembly 141 also supports a set of shim coils 156 associated with the main magnet 140 and used to correct inhomogeneities in the polarizing magnet field. In the case of a resistive magnet, a main power supply 157 is utilized to continuously energize the magnet 140 and in the case of a superconductive magnet, the main power supply 157 is utilized to bring the polarizing field produced by the magnet 140 to the proper operating strength and is then disconnected. In the case of a permanent magnet, power supply 157 is not needed.

The received NMR signal is at or around the Larmor frequency, which in the preferred embodiment is around 63.86 MHz. This high frequency signal is demodulated in transceiver 150. The resulting demodulated NMR signal has a bandwidth of 125 kHz and it is centered at a frequency of 187.5 kHz. The demodulated NMR signal is digitized by an analog-to-digital (A/D) converter also in transceiver 150 and the output of the A/D converter is applied to a digital quadrature detector in the transceiver 150 which produces 16-bit in-phase (I) values and 16-bit quadrature (Q) values corresponding to the received digital signal. The resulting stream of digitized I and Q values of the received NMR signal is output through backplane 118 to the memory module 160 where they are employed to reconstruct an image according to reconstruction techniques known in the art.

The NMR signals picked up by the RF coil 152 are digitized by the transceiver module 150 and transferred to a memory module 160 which is also part of the system control 116. When the scan is completed and an entire array of data has been acquired in the memory modules 160, an array processor 161 operates to Fourier transform the data into an array of voxel data. This voxel data is conveyed through the serial link 115 to the computer system 107 where it is stored in memory module 113. In response to commands received from the operator console 110, this voxel data may be stored for later use in the disk memory 111, or archived on the tape drive 112. It may be further processed by the image processor 106, and then conveyed to the operator console 100 and presented on the video display 104.

The voxel data is stored in memory module 113 at addresses related to the spatial coordinates of the voxel of the voxel data. Hence, only the value of the voxel data need be explicitly stored, the spatial coordinates are implicit from the address of the imaged data in the memory of memory module 113.

b. Computed X-Ray Tomography

Figure 2:
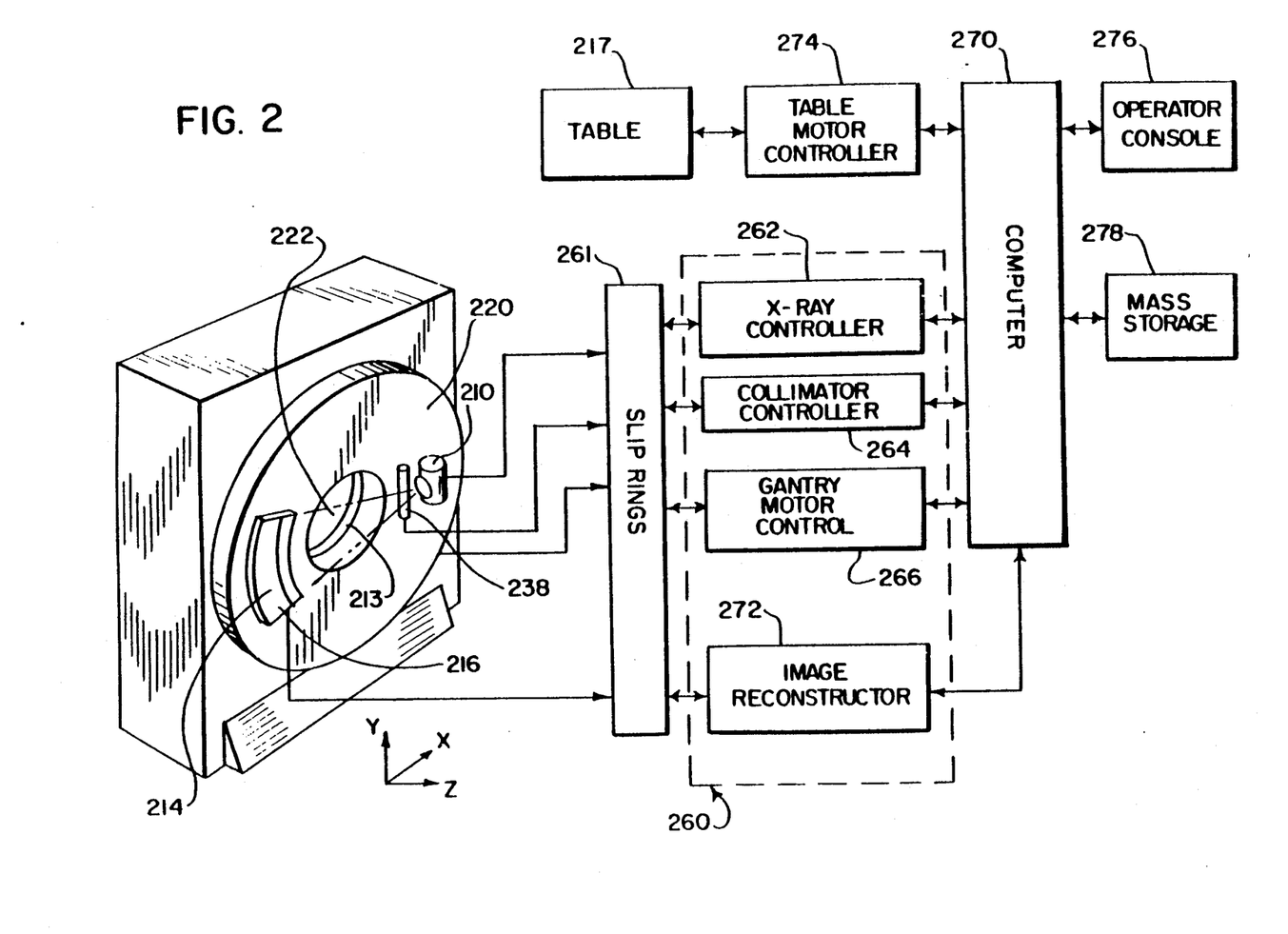
FIG. 2 is a schematic representation CT system as may be used with the present invention.

Referring to FIG. 2, a gantry 220, such as may be used in a "third generation" computed tomography (CT) scanner, includes an x-ray source 210 collimated by collimator 238 to project a fan beam of x-rays 222 through imaged object (not shown) to detector array 214. The x-ray source 210 and detector array 214 rotate on the gantry 220 about a center of rotation 213. The rotation of the gantry 220 is within a gantry plane aligned with the x-y plane of a Cartesian coordinate system.

The patient rests on table 217 which is radio-translucent so as not to interfere with the imaging process. Table 217 may be controlled so that its upper surface translates along the z axis perpendicular to the x-y imaging plane, moving the imaged object across the gantry plane.

The detector array 214 is comprised of a number of detector elements 216 organized within the gantry plane, which together detect the projected image produced by the attenuated transmission of x-rays through the patient.

The x-ray source 210 includes an anode (not shown) position within an evacuated glass envelope. A stream of electrons from a cathode (not shown) is accelerated against the face of the anode to produce the x-ray beam 222. The production of x-rays may be controlled by x-ray controller 262.

The control system of a CT scanner, suitable for use with the present invention, has gantry associated control modules 260 which include: x-ray controller 262 which provides power and timing signals to the x-ray source 210; collimator controller 264 which controls the positioning of the collimator 238; gantry motor controller 266 which controls the rotational speed and position of the gantry 220; and the image reconstructor 272 which receives projection data from the detector array 214 and processes it to produce voxel data. The image reconstructor 272 may be an array processor such as is manufactured by Star Technologies of Virginia.

The gantry associated control modules 260 communicate with the x-ray tube 210, collimator 238 and detector 214 via slip rings 261. It will be recognized that direct cabling using a take up reel may be substituted for the slip rings 261 for a limited gantry rotation system.

The x-ray controller 262, the collimator controller 264 and the gantry motor 266 controller are connected to a computer 270. The computer 270 is a general purpose minicomputer such as the Data General Eclipse MV/7800C and may be programmed to synchronize the rotation of the gantry 220 with the position of the fan beam 222.

The speed and position of table 217 along the z-axis is communicated to and controlled by computer 270 through of table motor controller 274. The computer 270 receives commands and scanning parameters via operator console 276 which is generally a CRT display and keyboard which allows an operator to enter parameters for the scan and to display the reconstructed image and other information from the computer 270. A mass storage device 278 provides a means for storing operating programs for the CT imaging system, as well as voxel data for future reference by the operator.

2. Voxel and Pixel Data

The technologies of MRI imaging and CT imaging differ but they are similar in the respect that they both produce an array of voxel data of physical parameters at a large number of points over a volume within a patient. Importantly, each voxel is identifiable by spatial coordinates. MRI and CT imaging may be broadly classed, in this respect, with other medical imaging systems such as ultrasound and positron emission tomography ("PET") which ultimately produce similar voxel data. Co-pending U.S. patent application Ser. No. 07/867,597, entitled: "Ultrasound Imaging System with Improved Dynamic Focusing", filed Apr. 13, 1992, and co-pending U.S. patent application Ser. No. 07/904,791, filed Jun. 26, 1992 entitled: "Gamma Ray Detector For PET Scanner", describe such systems. Both cases are assigned to the assignee of the present invention and are hereby incorporated by reference.

Figure 3:
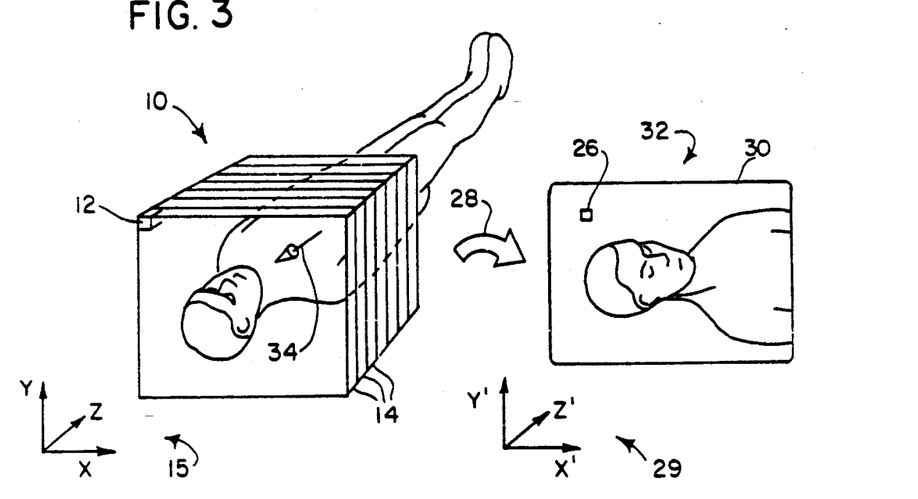
FIG. 3 is a pictorial representation of a volume of voxel data as acquired and as projected to an image plane.
Figure 4:
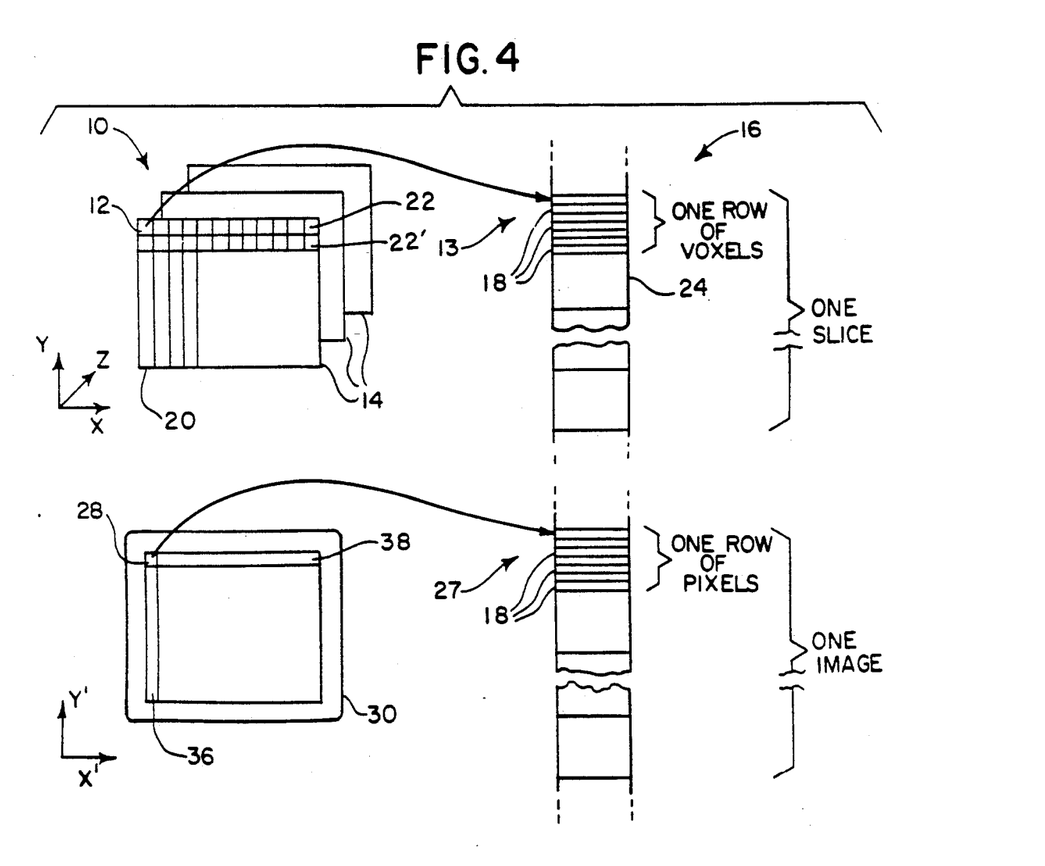
FIG. 4 is a schematic representation of the storage of voxel and pixel data at sequential addresses in computer memory.

Referring now to FIGS. 3 and 4, voxel data 13 produced by such systems are collected over an imaged volume 10 encompassing the region of interest of the patient. Each voxel 12 encloses a portion of the imaged volume 10 and identifies the volume of tissue to which the voxel data 13 is related.

The voxel data 13 associated with each voxel 12 is linked to a spatial coordinate, which for simplicity, is the spatial coordinate of the center of its voxel 12. This spatial coordinate is described by three measurements along the axes of a conventional Cartesian coordinate system. The orientation of the axes of the Cartesian coordinates are arbitrary, although ordinarily determined by the mechanics of the acquisition. The spatial coordinates of the voxels 12 and their corresponding voxel data 13 will be termed the acquisition coordinates 15 and represented by the variables x, y, and z.

For simplicity, and in keeping with the orthogonality of axes of the Cartesian coordinate system, each voxel 12 is a simple rectangular prism, the size of each side ordinarily being defined by the limits of resolution of the imaging system. The voxels 12 fill the imaged volume 10 without gaps, in rectilinear columns 20 along the y-axis, and rows 22 along the x-axis, and slices 14 along the z-axis.

To simplify storing the voxel data 13 in computer memory 16 which is addressed by sequential integer addresses, the units of the acquisition coordinates 15, (x, y, z), are normalized to the corresponding dimensions of the voxels 12 so that the acquisition coordinate of each voxel 12 for a given axis changes by one as one moves to the next voxel 12 along that axis. The acquisition coordinates 15 for each voxel 12 are integer values and hence more easily identified to particular integer addresses of the computer memory 16, as will be described further below.

Referring now to FIG. 4, the voxel data 13 of each voxel 12 of each slice 14 is stored in memory 16, such as memory module 113 in the above described MRI system or memory associated with computer 270 of the above described CT machine. Memory 16 includes a plurality of words 18 each having a unique and sequentially numbered integer address.

Each word 18 of memory 16 holds the voxel data 13 for one voxel 12. The normalization of the acquisition coordinates 15 allows the address of the particular word 18 to be used to indicate the acquisition coordinates 15 of the voxel 12. The voxels 12 are stored first by their order within a row 22, then according to their order in columns 20 and then according to their order in slices 14. The number of voxels 12 in a row 22 is fixed and known, as is the number of rows 22 and slices 14, therefore, the acquisition coordinates 15 of the voxel 12 are easily calculated from the address of the voxel data 13 in computer memory 16, and vice versa.

As a result of this mapping of voxels 12 to addresses of memory 16, the voxel data 13 of one row 20 of voxels 12 will be held in sequential words 18 of memory 16. The voxel data 13 of voxels 12 for a next row 22', adjacent to row 22, will be stored in words 18 forming a block 24 of memory 16 contiguous (with respect to address) to the block storing the voxels 12 of row 22. Thus, to the extent possible, voxel data 13 for voxels 12 that are spatially proximate are stored in words 18 of memory 16 that are close in address.

Referring again to FIGS. 3 and 4, in the present invention, the voxel data 13 associated with the imaged volume 10 will be converted to an image on a monitor 32. In this image, the voxel data 13 for selected voxels 12 are represented as a brightness or color of a picture element 26 ("pixel"). A pixel 26 will be typically the smallest unit of area in the image on the monitor 32 independently controllable in brightness or color. Pixels 26, in a manner analogous to voxels 12, are generally rectangular areas arranged contiguously over an image plane 30 of the image on monitor 32 in image coordinates 29 along rectilinear columns 36 along an axis x' and rows 38 along an image axis y'. A third axis z' runs normal to the image plane 30.

Pixel data indicating the brightness or color of each pixel is also stored in memory 16. As in the case with the voxels 12, the image coordinates of the pixels 26 may be deduced from the address of the particular word 18 to be used to store the pixel data 27. The data of the pixels 26 are stored first by their order within the row 38, then according to their order in columns 36. The number of pixels in a row 38 is fixed and known, as is the number of rows 38 and therefore, the image coordinates of the pixels 26 are easily calculated from the address of the pixel in computer memory 16, and vice versa. Also, as with the voxels, a result of this mapping of pixels 26 to addresses of memory 16, is that the pixel data 27 of one row 38 of pixels 26 will be held in sequential words 18 of memory 16. Thus, pixel data 27 for pixels 26 that are spatially proximate are stored in words 18 of memory 16 that are close in address.

3. Transformation of Voxel Data to Pixel Data

The imaged volume 10 is three-dimensional but the image on the monitor 32 is two-dimensional. For this reason, the voxel data 13 must be projected, as indicated by arrow 28 to "compress" it to the two dimensions of the image. The process of projection 28 requires a selection of a projection axis 34 which corresponds to a line-of-sight of a hypothetical viewer viewing the imaged volume 10, and which is normal to the surface of the image plane 30. The projection axis 34 is selected to best exhibit the structure of interest in the patient and will be parallel to the image axis z' when the image is displayed. After the projection axis is selected, voxels 12 having the same x' and y' coordinates are combined, according to one or more compression techniques, to produce the pixel data 27, as will be described below.

When the projection axis 34 is changed in angular orientation, the image formed on the monitor 32 appears to rotate about one of the three axes x, y and z. Accordingly, the selection of the angular orientation of the projection axis 34 may be understood to be a process of rotating the voxel data 13 of the voxels 12 about one or more of the three perpendicular acquisition axes, x, y, or z. Rotation about the y axis is termed "rotation", rotation about the x axis is termed "tilt" and rotation about the z axis will be termed "spin". Spin is also known as clockwise/counterclockwise in the art. Each of these rotations involve transforming the acquisition coordinates 15 of the voxel data 13 of a voxel 12 to produce new image coordinates. Such rotation of acquisition coordinates 15 of x, y and z to new image coordinates x', y' and z' are simply represented by a matrix multiplication as follows.

$$V' = M_s M_r M_t V \qquad (2)$$

where V' is the matrix of image coordinates $$\begin{bmatrix} x' \\ y' \\ z' \end{bmatrix},$$

and V is the matrix of acquisition coordinates 15:

$$\begin{bmatrix} x \\ y \\ z \end{bmatrix}.$$

The matrices $M_s$, $M_r$, and $M_t$ (which effect the spin, rotation and the tilt respectively) are as follows:

$$M_s = \begin{bmatrix} \cos(s) & -\sin(s) & 0 \\ \sin(s) & \cos(s) & 0 \\ 0 & 0 & 1 \end{bmatrix} \quad (3)$$

where s is the spin angle $$M_r = \begin{bmatrix} \cos(r) & 0 & -\sin(r) \\ 0 & 1 & 0 \\ \sin(r) & 0 & \cos(r) \end{bmatrix} \quad (4)$$

where r is the rotation angle, and $$M_t = \begin{bmatrix} 1 & 0 & 0 \\ 0 & \cos(t) & \sin(t) \\ 0 & -\sin(t) & \cos(t) \end{bmatrix} \quad (5)$$

where t is the tilt angle.

Selecting a projection axis by rotating the voxels 12 of the imaged volume 10 simply involves the matrix multiplication of the spatial coordinates of each voxel 12 by the product of the transformation matrices $M_s M_r M_t$. To reduce the number of calculations required, it is known to pre-multiply these three matrices $M_s M_r M_t$ together. The values of the angles s, r, and t do not change among voxels 12 and hence the product of $M_s M_r M_t$ is constant and need not be recomputed for each multiplication. In contrast, performing the matrix multiplications separately, that is multiplying the spatial coordinates of a voxel 12 first by $M_t$, and then by $M_r$, and then by $M_s$, although mathematically identical, triples the total computational effort and time required to perform the transformation.

Contrary to this reasoning, however, in the present invention, the application of the matrices $M_s M_r M_t$ is bifurcated, with the tilt and rotation matrices $M_r M_t$ being applied at one time, but the spin matrix $M_s$ being applied only after the compression of the voxel data 13 to pixel data 27 per the projection process 28. Each of these rotation matrices is independent, so they may be grouped together under the associative principal as desired. After multiplication by tilt and rotation matrices $M_r M_t$ but before multiplication spin matrix $M_s$, the rotated acquisition coordinates 15 will be designated x", y" and z".

Figure 6:
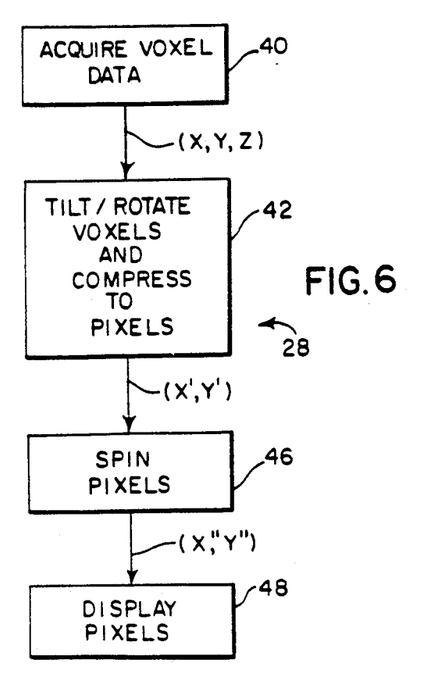
FIG. 6 is a flow chart of the steps of the present invention.

Referring now to FIG. 6, voxel data 13 is acquired by means of an imaging system. This acquisition is depicted by first process block 40 and may involve the use of the MRI or CT systems as described above or other similar systems. At process block 42, the acquisition coordinates 15 of each voxel V are tilted and rotated only, by multiplying a matrix of the acquisition coordinates $$\begin{bmatrix} x \\ y \\ z \end{bmatrix}$$

by the matrix product of $m_r M_t$.

Also at process block 42, but after the tilting and rotation, the voxel data 13 of voxels 12 are compressed on a row by row basis, along the z axis, according to techniques discussed in detail below, to produce pixels 26 having image coordinates x' and y'.

At process block 46, the coordinates of these pixels 26 are rotated about the z axis by multiplication of their coordinates by the matrix $M_s$. These rotated pixels 26 are then displayed at process block 48.

Figure 5A:
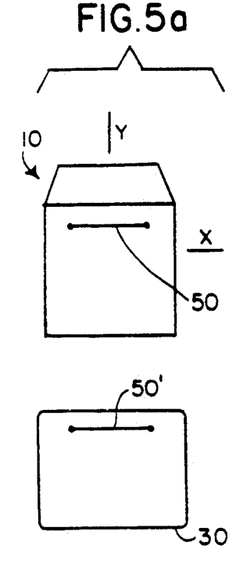
FIGS. 5(a)-(c) are perspective views of one row of voxels in a volume array and the projection of that row to the image plane after tilting and rotation.
Figure 5B:
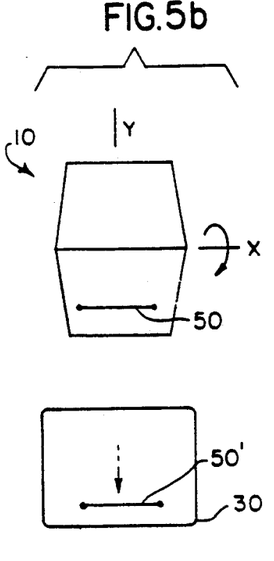
Figure 5C:
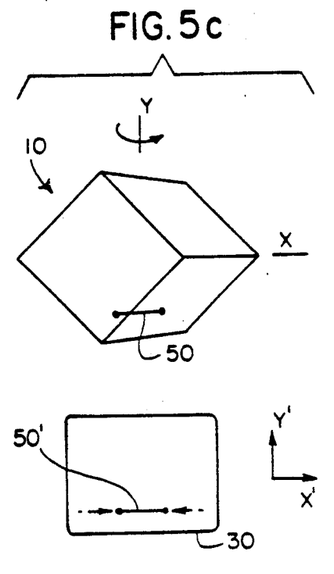

The purpose of the bifurcation of the rotation process, employing matrices $M_r M_t$ before the compression step of process block 42, and matrix $M_s$ after the compression step of block 42, is illustrated in FIGS. 5(a) through 5(c). The original, non-rotated imaged volume 10 includes a representative row 22 aligned with the x axis. Prior to tilting, this row 22 projects to a row 38 in the imaging plane 30 aligned with the x' axis. As shown in FIG. 5(b), after tilting about the x axis, row 22 is displaced along the y' and z' axis without rotation of row 38 in the imaging plane 30. Similarly, and referring to FIG. 5(c), with rotation of the imaged volume 10 about the y axis, the representative row 22, as projected to row 38 in the imaging plane 30, becomes shorter but still does not rotate within the imaging plane 30.

This will be true for any arbitrary row of voxels 22 within the imaged volume 10 as may be better understood by referring to the product of matrices $M_r M_t$ (shown in equation below) which represent the tilting and rotation only of the coordinates of the imaged volume 10:

$$M_r M_t = \begin{bmatrix} \cos(r) & \sin(r)\sin(t) & -\sin(t)\cos(t) \\ 0 & \cos(t) & \sin(t) \\ \sin(r) & -\cos(r)\sin(t) & \cos(r)\cos(t) \end{bmatrix} \quad (6)$$

Matrix sub-element column 2, row 1 is zero. As a result, changes in x (as one traverses a row 22) do not affect the ultimate value of the y" coordinate obtained by multiplying the acquisition coordinates 15 by the matrix (6). Simply put, a row of data 22 in the original imaged volume 10 maps to a row of data 38 in the imaging plane 30. This results in: (1) faster reading from and writing to the memory 16 for reading voxel data 13 and for storing pixel data 27 and (2) improved the efficiency of the tilting and rotate transformations by allowing reuse of calculations made for adjacent voxels. Both of these improvements will be described in detail below.

Figure 7:
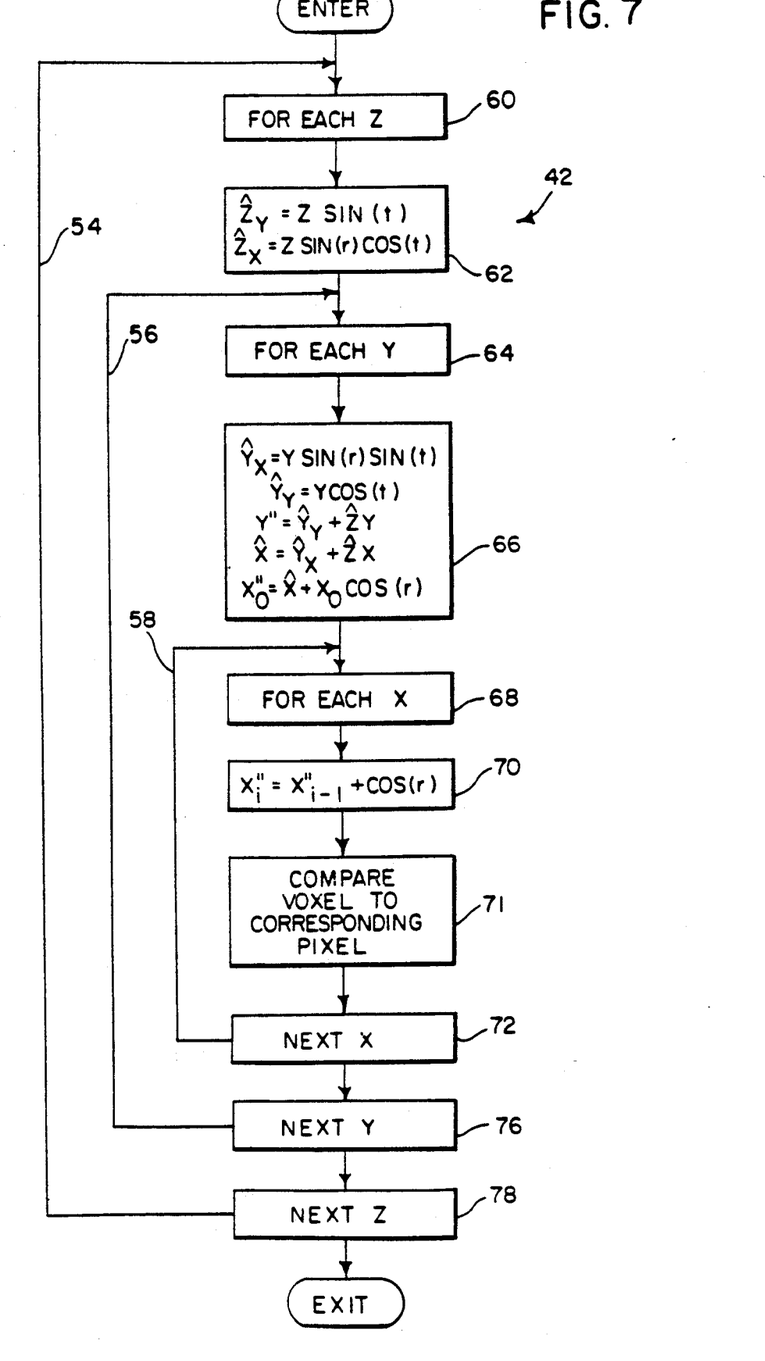
FIG. 7 is a detailed flow chart of the second step of FIG. 6.

The tilt/rotate step of process block 42 of FIG. 6 is shown in FIG. 7 and comprise a series of loops identified by paths 54, 56 and 58. These loops step sequentially through the voxel data 13 by memory address and hence by acquisition coordinate because of the correlation of address and acquisition coordinate. The loops 54, 56, 58 read each voxel by its slice 14 then by column its 20 and then by its row 22, respectively.

For each z value of the acquisition coordinate, per process block 60 and loop 54, and hence for each slice 14, shared values $\hat{z}_x$ and $\hat{z}_y$ are computed as indicated by process block 62 and equations (7) and (8) below.

$$\hat{z}_x = -z \sin(r)\cos(t) \quad (7)$$

$$\hat{z}_y = z \sin(t) \quad (8)$$

These values $\hat{z}_x$ and $\hat{z}_y$ need only be computed once for each slice 14.

Next, and within loop 54, at process block 64, the loop 56 begins and a first y value of the acquisition coordinate is selected to identify a row 22 within the slice selected at process block 60. For each such row 22 selected at process block 64 for loop 56, shared values $\hat{y}_x$ and $\hat{y}_y$ are calculated at process 66 as follows:

$$\hat{y}_x = y \sin(r)\sin(t) \quad (9)$$

$$\hat{y}_y = y \cos(t) \quad (10)$$

In addition, the rotated coordinate y" for each voxel in the row selected by the value of y may be pre-computed according to the following equation being a portion of the matrix multiplication of the coordinates of the voxels times the matrix of equation (6) above:

$$y'' = \hat{y}_y + \hat{z}_y \quad (11)$$

Further, a portion of the calculation of x" described below may be precomputed as follows:

$$\hat{x} = \hat{y}_x + \hat{z}_x \quad (12)$$

and $$\hat{x}_0 = \hat{x} + x_0 \cos(r) \quad (13)$$

where $x_0$ is the first value of x in a row 22.

Next, and within the loops 54 and 56, at process block 68, loop 58 is entered. Within this loop 58, an x value or column 20 is selected. At this point a particular voxel 12 has been identified by its complete acquisition coordinate. At process block 70, the rotated coordinate x" of each voxel 12 in the row 22 and slice 14 selected in loops 56 and 54 is determined according to the following equation (14) which is a portion of the matrix multiplication of the coordinates of the voxels 12 times the matrix of equation (6) above:

$$\hat{x}_i = \hat{x} + x_i \cos(r) \quad (14)$$

A value for z" could be computed but is not required in the preferred embodiment as will be explained below. Omission of the calculation of z" further simplifies the translation of the voxel coordinates.

It will be understood, in referring to equation (14) of process block 70, that only a single multiplication is required: x cos(r) and that the term: cos(r) may be pre-computed and stored. Thus, the most often repeated block of the loops of FIG. 7, that is, the calculation of process block 70, may be computed extremely rapidly on conventional computer systems. Further, because the x increment between voxels in a row is one, the quantity $x_i \cos(r)$ for a given voxel at $x_i$ may be obtained simply by adding the constant cos(r) to the quantity $x_{i-1} \cos(r)$ as calculated at the previous voxel at $x_{i-1}$. The most often repeated calculation in the loops 54, 56, and 58 is then simply the addition of a constant cos(r) according to the following equation (14'):

$$x_i'' = x_{i-1}'' + \cos(r) \quad (14')$$

This speed gain is intimately linked to the bifurcation of the tilt/rotate step 42 and a spin step 46. If tilt, rotate and spin were to be performed at one time, the value y" (in fact y') could not be pre-computed at process block 66 but would have to be repeated at much greater frequency at process block 70. This is because it would be dependant on the y axis coordinate value, not selected until process block 68. Additional savings in calculation time is obtained by the ability to discard z" information which results from the compression scheme of block 42 which will be described below.

At process block 71, after the calculation of each value of x" and y" for each voxel 12, the values of each voxel is compared to a corresponding pixels 26 at pixel coordinate x' equal to x" and y' equal to y" to effect the compression of process block 42 as described below.

The loops of 54, 56 and 58 are closed by process blocks 72 through 76 respectively. Process block 72 increments the value of x until an entire row 22 of voxels 26 have been scanned and then allows the program to proceed to process block 76 for the next value of y or the next row 22. When each of the x and y values has been incremented for a slice 14, process block 76 allows the program to proceed to process block 78 where the next slice 14 or z value is selected and loops 56 and 58 are repeated for that slice. When each of the voxels of the slices 14 has been rotated, the entire imaged volume 10 has been transformed and the program exits.

A second speed advantage attendant to the bifurcation of the tilt/rotate step 42 (of FIG. 6) from the spin step 46, results from the fact that a row of voxels 12 projects to a row of pixels 26 (as described above with respect to FIG. 5(a) through 5(b)) and that the data of both pixels 26 and voxels 12 is stored so that rows of data are at proximate addresses in memory. The ability to read and to write to a single row either in the imaged volume 10 or the display plane 30 allows utilization of memory caching systems where blocks of contiguous memory are moved from slow storage devices such as on-board dynamic random access memory ("DRAM") to fast storage devices such as on-chip cache memory. The speed advantages of such systems rely on the processing of information at adjacent addresses as provided by the present invention as opposed to systems where the associated voxels and pixel data 27 might be stored at non-consecutive addresses. Caching schemes, which implicitly attempt to predict the next memory to be used, are more successful when memory is read or written to at consecutive addresses.

The spatial coordinates of the voxels 12 as rotated per process block 42 will not necessarily be integer values. For example, a voxel having spatial coordinates 1, 2 and 4 may rotate to a voxel having spatial coordinates 1.2, 3.6 and 5.2. Accordingly the transformed coordinates may be truncated to integer values corresponding to possible integer addresses. Alternatively, new values of voxel or pixel data 27 may be interpolated at integer coordinates between the transformed coordinates. This latter procedure is not adopted in the preferred embodiment as it requires preservation of z" information (the importance of which is discussed below) and the allocation of additional memory to store rotated voxels prior to interpolation.

Referring again to FIG. 6, as the tilt and rotate of process block 42 is performed, the transformed acquisition coordinates x" and y" are also compressed along the z axis to obtain a set of pixels 26 having x' and y' coordinates by equating x' with x" and y' with y". That is, although the compression follows the tilt and rotate of the spatial coordinates of the voxels 12, the transformation is undertaken on a row by row basis to eliminate unnecessary memory operations.

Compression of rows of voxel data 13 is known in the art and generally requires selecting among the voxels 12 along a particular ray aligned with a projection axis 34. In the preferred embodiment, the compression method is chosen from those indifferent to the z" coordinate of the transformed acquisition coordinates (x", y" and z") of the voxels 12, thus allowing the elimination of calculation of z" in process block 70 of FIG. 7. A number of compression systems meet this requirement including that of finding the minimum or maximum voxel value for a given x' and y' image coordinate or computing a summation of all voxel values for a given value of x' and y'. The compression in process block 42 is performed by comparing the tilted and rotated voxel data 13 of each row to the value of a pixel with corresponding values of x' and y'. When the maximum value of voxel data 13 is sought for a given value of x' and y', the memory 16 for pixels 26 is initially loaded with a value lower than any possible value of voxel data 13. Each transformed voxel datum is then compared to the corresponding pixel datum in memory 16. If the voxel datum is greater than the pixel datum, that voxel datum replaces the pixel datum. Once all voxel data 13 for all rows has been transformed and compared to the pixel values, the value at each pixel 26 will represent the highest valued voxel data 13 along the given z' axis.

After the compression of the voxel data 13 to pixels in the x' y' plane, the pixels are further transformed by spinning about the z' axis according to process block 46. This separate step of spinning the pixels in process block 46, distinct from the rotation and tilting of the voxels in 42, increases somewhat the number of operations required for the full transformation over that which would be required if the rotation, tilt and spin were performed with a single matrix multiplication. It will be recognized, however, that typically there are far fewer pixels 26 than voxels 12 and thus that the spinning operation of process block 46 is correspondingly more efficient. The additional burden of calculation required by the separate spin step of process block 46 is more than made up for by the computational efficiencies gained in the previously described tilt and rotate operation of process block 42. In operation with present computer technology, the present invention can reduce the time taken to transform a 256 by 256 by 60 matrix of voxel data 13 represented by an MRI or CT scan to near real time speeds.

At process block 48, a brightness or color value is assigned to the value of each of the pixels 26 for display on the display 32. The brightness may be in simple proportion to the value of the pixel data 27.

As with the voxel data 13, the image coordinates of the pixels 26 will not necessarily have integer values after the spin of process block 46. Accordingly, the transformed coordinates are truncated to integer values corresponding to possible integer addresses or new values of pixel data 27 are interpolated at integer coordinates between the transformed coordinates.

Many modifications and variations of the preferred embodiment which will still be within the spirit and scope of the invention will be apparent to those of ordinary skill in the art in order to apprise the public of the various embodiments that may fall within the scope of the invention, the following claims are made.

We claim:

1. A method of generating a diagnostic image of a body comprising the steps of:
   directing a radiated energy through a region of interest of the body;
   detecting the interaction of the energy with the body to acquire data at a plurality of voxels, the voxels having spatial coordinates located within the region of interest wherein the value of the datum of each voxel corresponds to a physical property of the body at the spatial coordinate;
   transforming the spatial coordinates of each voxel by a rotation about a first and second perpendicular axis;
   compressing the voxels along a third axis orthogonal to the first and second axis to produce data of pixels in a plane, the pixels having first and second image coordinates orthogonal to the third axis;
   transforming the image coordinates of each pixel by rotation about the third orthogonal axis; and
   displaying the pixel data by mapping each pixel to a point on a display with display coordinates corresponding to the image coordinates.

2. The method of claim 1 wherein the voxel data is x-ray attenuation data produced in a three dimensional field by a computed tomography system.

3. The method of claim 1 wherein the voxel data is nuclear magnetic resonance data produced in a three dimensional field by magnetic resonance imaging system.

4. The method of claim 1 wherein the voxel data is compressed along the third axis by selecting the voxel datum with the most extreme value within a region extending parallel to the third axis.

5. The method of claim 1 including the steps of:
   storing the acquired voxel data at first addresses in an electronic memory so that voxels which are spatially adjacent along the first axis are stored at consecutive addresses;
   reading the electronic memory at sequential addresses to obtain voxel data for rotation about the first and second axis; and
   storing the pixel data at second addresses in the electronic memory so that pixels which are spatially adjacent along the first axis are stored at consecutive address locations.

6. The method of claim 1 wherein the step of transforming the voxel data comprises:
   calculating, for a first voxel along the first axis, a first value of an image coordinate and a second image coordinate; and
   calculating, for subsequent adjacent voxels along the first axis, only a value of the second image coordinate and employing the previously calculated first value for the value of the first image coordinate.

7. An apparatus generating a diagnostic image of a body comprising:
   a means for directing a radiated energy through a region of interest of the body;
   a means for detecting the interaction of the energy with the body to acquire data at a plurality of voxels, the voxels having spatial coordinates located within the region of interest wherein the value of the datum of each voxel corresponds to a physical property of the body at the spatial coordinate;
   a means for transforming the spatial coordinates of each voxel by a rotation about a first and second perpendicular axis;
   a means for compressing the voxels along a third axis orthogonal to the first and second axis to produce data of pixels in a plane, the pixels having first and second image coordinates orthogonal to the third axis;
   a means for transforming the image coordinates of each pixel by rotation about the third orthogonal axis; and a means for displaying the pixel data by mapping each pixel to a point on a display with display coordinates corresponding to the image coordinates.

8. The apparatus of claim 7 wherein the directing means is an x-ray tube and wherein the detecting means is an array of x-ray detectors to provide voxel data related to the attenuation of the x-rays by the body.

9. The apparatus of claim 7 wherein the directing means is an RF coil for transmitting RF energy and the detecting means is and RF antenna for receiving NMR signals to provide voxel data related to the precessing of protons caused by the RF energy.

10. The apparatus of claim 7 wherein the compression means includes means for selecting the voxel datum with the most extreme value within a region extending parallel to the third axis.

11. The apparatus of claim 7 including:
an electronic memory;
a first means for storing the acquired voxel data at first addresses in an electronic memory so that voxels which are spatially adjacent along the first axis are stored at consecutive addresses;
a first means for reading the electronic memory at sequential addresses to obtain voxel data for rotation about the first and second axis; and
a second means for storing the pixel data at second addresses in the electronic memory so that pixels spatially adjacent along the first axis are stored at consecutive address locations.

12. The apparatus of claim 7 wherein the means for transforming the spatial coordinates of each voxel by a rotation about a first and second perpendicular axis comprises:
means for calculating, for a first voxel along the first axis, a first value of an image coordinate and a second image coordinate; and
means for calculating, for subsequent adjacent voxels along the first axis, only a value of the second image coordinate and employing the previously calculated first value for the value of the first image coordinate.

* * * * *

UNITED STATES PATENT AND TRADEMARK OFFICE
CERTIFICATE OF CORRECTION

PATENT NO. : 5,295,488
DATED : March 22, 1994
INVENTOR(S) : Lloyd et al.

It is certified that error appears in the above-indentified patent and that said Letters Patent is hereby corrected as shown below:

Col. 2, line 4,

"$A - A_0 e^{t/T_2^*}$" should be --$A = A_0 e^{-t/T_2^*}$--.

Col. 6, line 30,

"and $z = \partial B_z / \partial z$" should be --and $G_z = \partial B_z / \partial z$--.

Col. 11, line 63,

"matrix product of $m_r M_t$". should be --matrix product of $M_r M_t$--.

Col. 12, line 24,

"equation below)" should be --equation 6 below)--

Col. 12, line 29,

"$= \begin{bmatrix} \cos(r) & \sin(r)\sin(t) & -\sin(t)\cos(t) \\ 0 & \cos(t) & \sin(t) \\ \sin(r) & -\cos(r)\sin(t) & \cos(r)\cos(t) \end{bmatrix}$"

should be $= \begin{bmatrix} \cos(r) & \sin(r)\sin(t) & -\sin(r)\cos(t) \\ 0 & \cos(t) & \sin(t) \\ \sin(r) & -\cos(r)\sin(t) & \cos(r)\cos(t) \end{bmatrix}$

UNITED STATES PATENT AND TRADEMARK OFFICE
CERTIFICATE OF CORRECTION

PATENT NO. : 5,295,488
DATED : March 22, 1994
INVENTOR(S) : Lloyd et al.

It is certified that error appears in the above-indentified patent and that said Letters Patent is hereby corrected as shown below:

Col. 13, line 23,

"$\hat{x}_0 = \hat{x} + x_0 \cos(r)$"   should be --$x_0'' = \hat{x} + x_0 \cos(r)$--

Col. 13, line 36,

"$\hat{x}_i = \hat{x} + x_i \cos(r)$"   should be --$x_i'' = \hat{x} + x_i \cos(r)$--

Signed and Sealed this

Twelfth Day of July, 1994

Attest:

BRUCE LEHMAN

*Attesting Officer*     Commissioner of Patents and Trademarks